United States Patent
Chang et al.

(10) Patent No.: US 11,184,595 B2
(45) Date of Patent: Nov. 23, 2021

(54) COLOR CORRECTION USING A SENSOR TO REDUCE COLOR DISTORTIONS OF A CAMERA UNDER A DISPLAY

(71) Applicant: Google LLC, Mountain View, CA (US)

(72) Inventors: YungSheng Chang, New Taipei (TW); Yan-Jang Jiang, Taoyuan (TW); Yenyu Peng, New Taipei (TW)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 17/324,688

(22) Filed: May 19, 2021

(65) Prior Publication Data
US 2021/0297637 A1 Sep. 23, 2021

Related U.S. Application Data

(60) Provisional application No. 63/160,391, filed on Mar. 12, 2021.

(51) Int. Cl.
*H04N 9/73* (2006.01)
*H04N 9/04* (2006.01)
*H01L 27/32* (2006.01)

(52) U.S. Cl.
CPC .......... *H04N 9/735* (2013.01); *H04N 9/0451* (2018.08); *H01L 27/3234* (2013.01)

(58) Field of Classification Search
CPC ... H04N 9/0451; H04N 9/735; H01L 27/3234
See application file for complete search history.

(56) References Cited

U.S. PATENT DOCUMENTS

| 7,609,310 B2* | 10/2009 | Miyagawa | H04N 7/144 |
| | | | 348/302 |
| 10,614,752 B1 | 4/2020 | Dodson et al. | |
| 2016/0282987 A1 | 9/2016 | Choi et al. | |
| 2018/0301080 A1 | 10/2018 | Shigeta et al. | |
| 2019/0123112 A1 | 4/2019 | Lee et al. | |
| 2019/0392772 A1 | 12/2019 | Kriebernegg et al. | |
| 2021/0020698 A1 | 1/2021 | Xianyu et al. | |

FOREIGN PATENT DOCUMENTS

WO 2020133814 7/2020

OTHER PUBLICATIONS

Shin, et al., "Dynamic Voltage Scaling of OLED Displays", Jun. 2011, 6 pages.

* cited by examiner

Primary Examiner — Daniel M Pasiewicz
(74) Attorney, Agent, or Firm — Colby Nipper PLLC

(57) ABSTRACT

This document describes techniques for color correction using a sensor to reduce color distortions of a camera under a display of a computing device. A correction module of the computing device may determine a color correction used to improve content captured by a camera utilizing, in part, a sensor (e.g., a camera, ambient light sensor, and so forth) positioned underneath the display. The sensor may detect ambient light over time that is modified as it travels through the display, producing color distortions. The sensor may also detect a composite light over time that includes calibration light emitted by the display and ambient light. The correction module may compare the ambient light and composite light to determine the color correction usable to improve both the content captured by the camera and a user experience.

11 Claims, 7 Drawing Sheets

400 ⎯↘

```
┌─────────────────────────────────────────────────────────────────────┐
│  Signal a sensor of a computing device to transition from an inactive state to │
│ an active state, the active state configured to enable the sensor to detect light, │
│   the sensor positioned at least partially underneath a display of the computing │
│      device, the signal of the sensor configured to repeat over a duration of time │
│                                    402                              │
└─────────────────────────────────────────────────────────────────────┘
                                    ↓
┌─────────────────────────────────────────────────────────────────────┐
│    Responsive to the signaling of the sensor, receive an indication of an │
│   operational state of the display, the operational state comprises a first │
│   operational state configured to activate a display light, the display light │
│       configured to emit light from the display when activated, the display light │
│    generated by the computing device to display content on the display, or a │
│        second operational state configured to deactivate the display light, the │
│    display light further configured to refrain from emitting light when deactivated │
│                                    404                              │
└─────────────────────────────────────────────────────────────────────┘
                                    ↓
┌─────────────────────────────────────────────────────────────────────┐
│  Responsive to receiving the indication of the second operational state, detect an │
│       ambient light using the sensor at a first time within the duration of time, the │
│   ambient light generated external to the computing device and modified by one or │
│    more layers of the display to cause color distortions in the detected ambient light │
│                                    406                              │
└─────────────────────────────────────────────────────────────────────┘
                                    ↓
┌─────────────────────────────────────────────────────────────────────┐
│          Responsive to receiving the indication of the first operational │
│        state, detect a composite light using the sensor at a second │
│      time within the duration of time, the composite light comprising │
│           the ambient light and at least a portion of the display light │
│                                    408                              │
└─────────────────────────────────────────────────────────────────────┘
                                    ↓
┌─────────────────────────────────────────────────────────────────────┐
│   Compare the composite light and the ambient light to provide a color │
│  correction, the color correction configured to reduce the color distortions of │
│     the detected ambient light as detected by the sensor through the display │
│                                    410                              │
└─────────────────────────────────────────────────────────────────────┘
                                    ↓
┌─────────────────────────────────────────────────────────────────────┐
│   Apply the color correction to content captured by a camera of the computing │
│     device, the camera positioned at least partially underneath the display, the │
│      camera configured to receive the ambient light through the display │
│                                    412                              │
└─────────────────────────────────────────────────────────────────────┘
```

FIG. 4

COLOR CORRECTION USING A SENSOR TO REDUCE COLOR DISTORTIONS OF A CAMERA UNDER A DISPLAY

SUMMARY

This document describes techniques for color correction using a sensor to reduce color distortions of a camera under a display of a computing device. A correction module of the computing device may determine a color correction used to improve content captured by a camera utilizing, in part, a sensor (e.g., a camera, ambient light sensor, and so forth) positioned underneath the display. The sensor may detect ambient light periodically over time that is modified as it travels through the display, producing color distortions. The sensor may also detect a composite light periodically over time that includes calibration light emitted by the display and ambient light. The correction module may compare the ambient light and composite light to determine the color correction usable to improve the content captured by the camera and enhance a user experience.

Aspects described below include a method of color correction using a sensor to reduce color distortions of a camera under a display. The method includes signaling a sensor of a computing device to transition from an inactive state to an active state. The sensor is positioned at least partially underneath a display of the computing device, and the active state enables the sensor to detect light. The sensor is signaled repeatedly over a duration of time. Responsive to signaling the sensor, an indication of an operational state of the display is received. The operational state includes a first operational state used to activate a display light and a second operational state used to deactivate the display light. The display light is generated by the computing device to display content on the display. The display light emits light from the display when activated and refrains from emitting light when deactivated. Responsive to receiving the indication of the second operational state, an ambient light is detected using the sensor at a first time within the duration of time. The ambient light is generated external to of the computing device and is modified by one or more layers of the display to cause color distortions in a detected ambient light. The detected ambient light is detected by the sensor. Responsive to receiving the indication of the first operational state, a composite light is detected using the sensor at a second time within the duration of time. The composite light includes the ambient light and at least a portion of the display light. The composite light and the ambient light are compared to provide a color correction used to reduce the color distortions of the detected ambient light as detected by the sensor through the display. The color correction is applied to content captured by a camera of the computing device. The camera is positioned at least partially underneath the display and receives the ambient light through the display.

BRIEF DESCRIPTION OF DRAWINGS

Techniques for color correction using a sensor to reduce color distortions of a camera under a display are described with reference to the following drawings. The same numbers are used throughout the drawings to reference like features and components:

FIG. 1-2 illustrates an example plot of the degradation of the transmission of light passing through the display as a function of wavelength;

FIG. 2 illustrates an example computing device that may implement aspects of color correction in accordance with the techniques described herein;

FIGS. 3-1, 3-2, and 3-3 illustrate example implementations of the color correction techniques performed by the correction module over time; and FIG. 4 depicts an example method for color correction using a sensor to reduce color distortions of a camera under a display.

DETAILED DESCRIPTION

Example of Color Distortions

Positioning sensors underneath a display of a computing device can increase a size of the display used to view content. Some of these displays include a transparent layer that degrades (e.g., changes in color and/or opacity) over time and can affect the performance of these sensors. For a camera positioned underneath the display, captured content (e.g., images, videos) may include color distortions caused by ambient light being modified as it travels through the transparent layer. These color distortions can change a color of the content captured by the camera and detract from a user experience.

Figure 1:
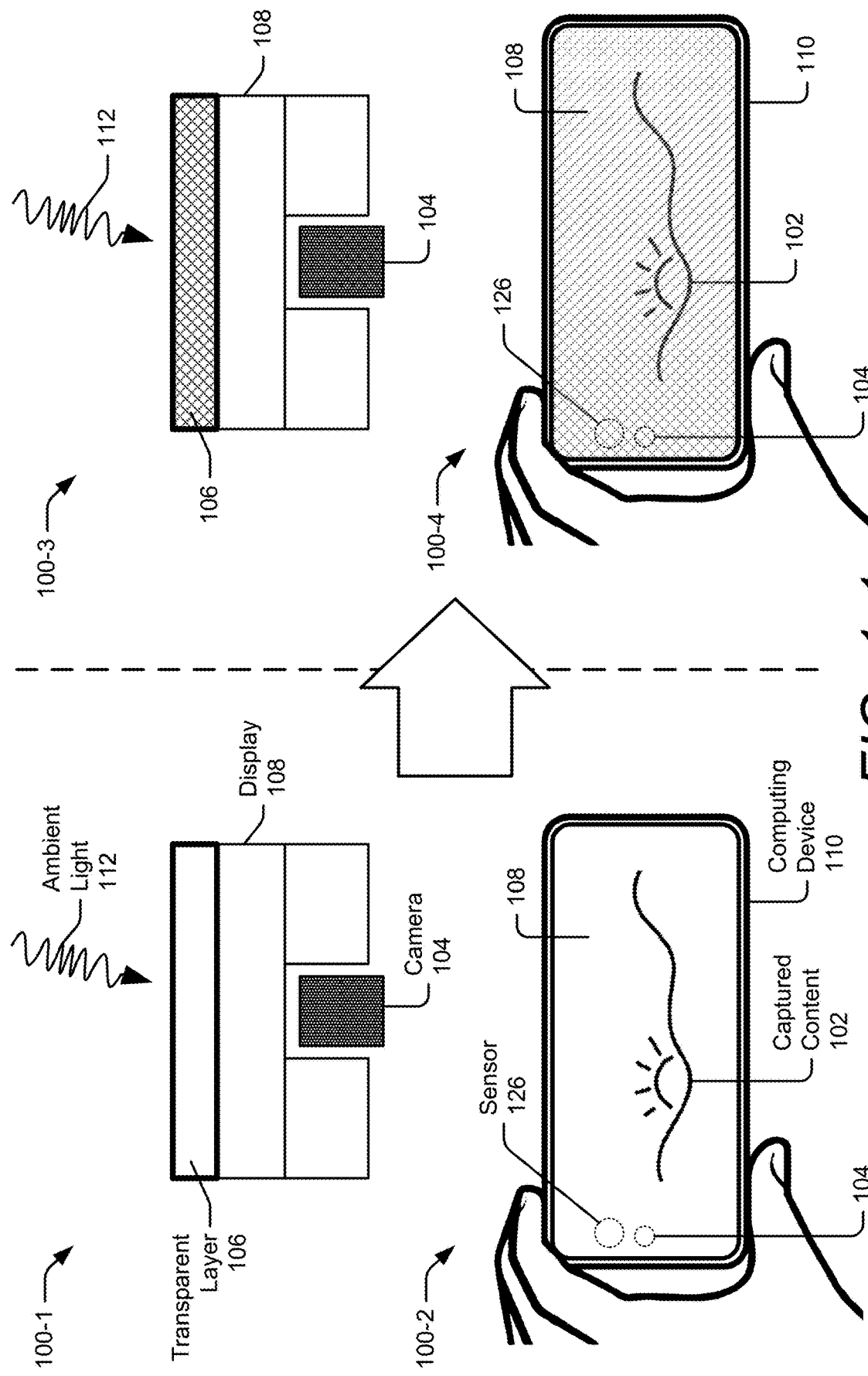
FIG. 1-1 illustrates example implementations of color distortions of content (e.g., captured content) that is captured by a camera due to the degradation of a transparent layer of a display of a computing device.

FIG. 1-1 illustrates example implementations 100 of color distortions of content (e.g., captured content 102) that is captured by a camera 104 due to the degradation of a transparent layer 106 of a display 108 of a computing device 110. Example implementation 100-1 depicts the transparent layer 106 at an early time (e.g., as manufactured) without discoloration, resulting in captured content 102 without color distortions as depicted in 100-2. Over time, the transparent layer 106 may degrade as depicted in 100-3, resulting in color distortions of the captured content 102 as depicted in 100-4.

The camera 104 may be positioned at least partially underneath the display 108 to increase a size of the display 108 used to view content. The camera 104 may detect ambient light 112, generated outside of the computing device 110, when capturing an image or video. The ambient light 112 may include light from the sun, light from an indoor source (e.g., a lamp), light reflected off of a surface distinct from the computing device 110, and so forth. The ambient light 112 may pass through the transparent layer 106 before being detected by the camera 104. In some aspects, the transparent layer 106 may modify attributes of the ambient light 112, resulting in color distortions of the captured content 102.

Figures 1, 2:
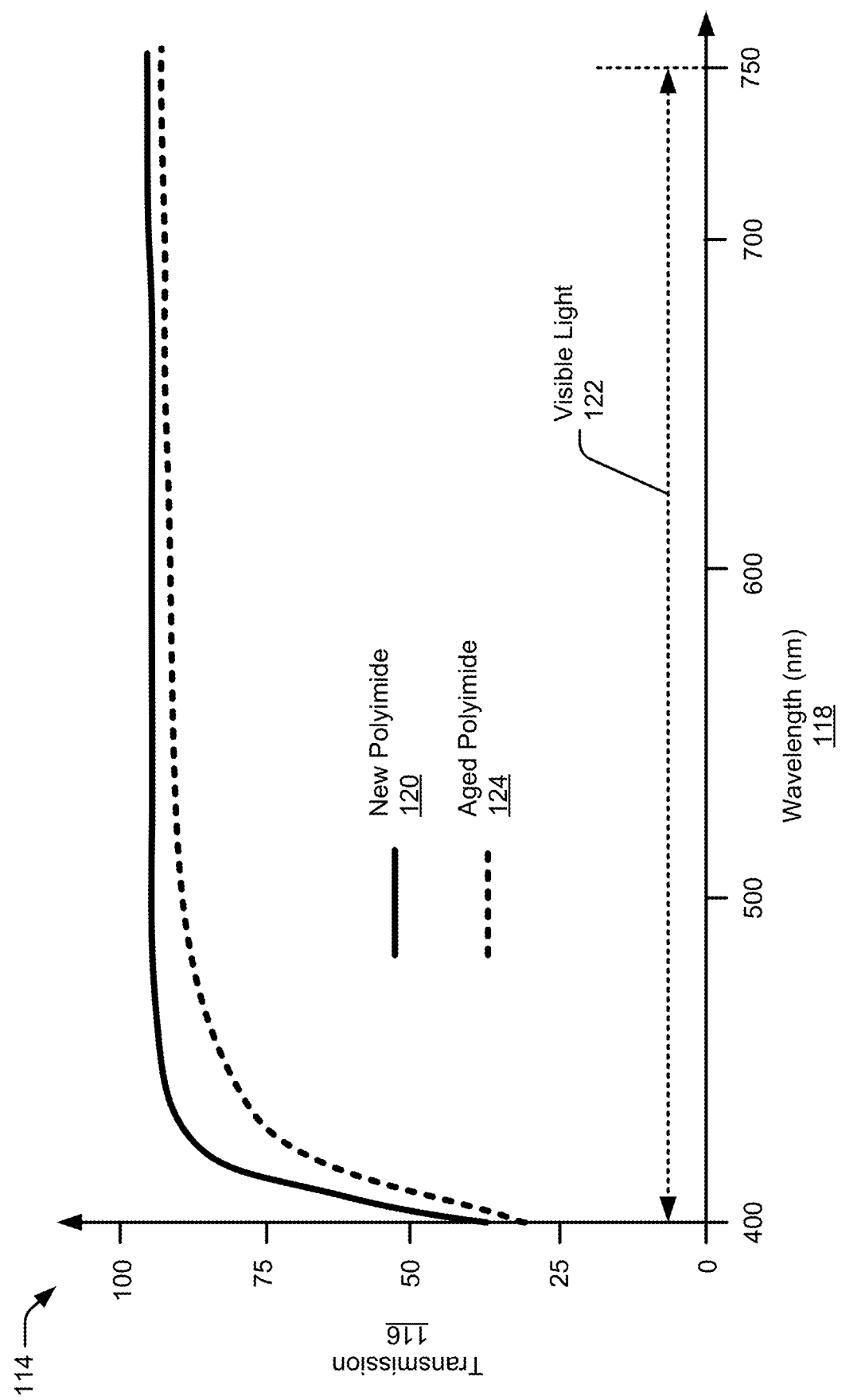
Figure 2:
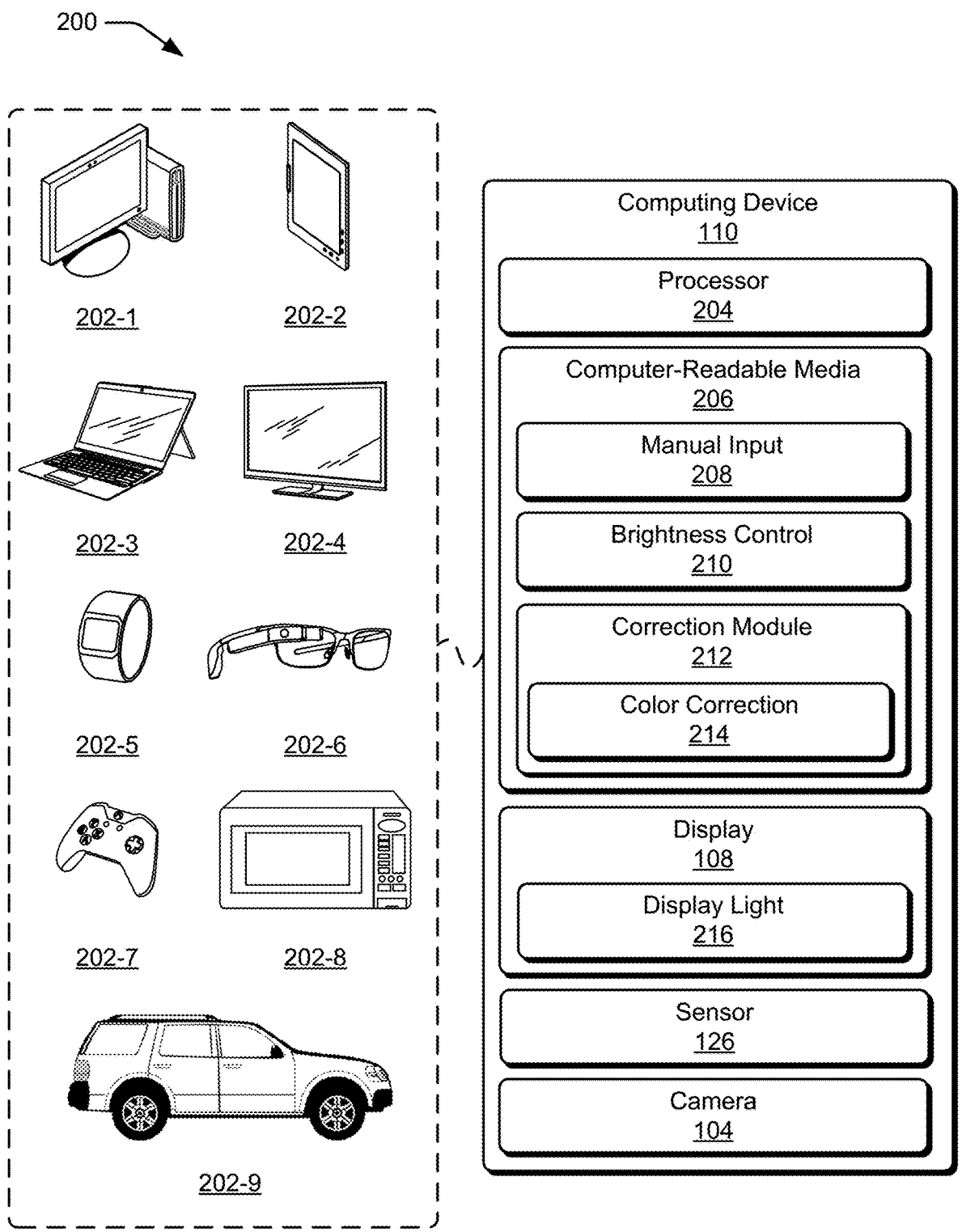

For example, the transparent layer 106 in example implementation 100-1 may degrade in color over time, resulting in color distortions associated with the transparent layer 106 depicted in example implementation 100-3. FIG. 1-2 illustrates an example plot 114 of the degradation of the transmission 116 of light passing through the display 108 as a function of wavelength 118. The example plot 114 compares example data using a polyimide material for the transparent layer 106. In general, the transparent layer 106 may utilize any transparent material, including plastic, glass, a composite material, and so forth. Transmission of light using a new polyimide 120 transparent layer 106 is depicted with a nearly flat transmission 116 response corresponding to visible light 122 of the electromagnetic spectrum. For example, transmission 116 of red colors (e.g., near 700 nanometers (nm)) is similar to transmission 116 of blue colors (e.g., near 450 nm).

Over time, the new polyimide 120 may degrade, resulting in a change in color of the transparent layer 106. For example, the new polyimide 120 may change color due to thermal imidization caused by heating of the display, in part, due to ultraviolet (UV) radiation. The new polyimide 120 may become oxidized over time, resulting in a yellow tint of an aged polyimide 124 transparent layer 106. The aged polyimide 124 is depicted in 100-5 with lower transmission 116 at lower wavelengths 118 that may shift light emitted by the display 108 and/or detected by sensors 126 positioned underneath the display 108, including the camera 104, towards longer wavelengths 118. For aged polyimide 124, the ambient light 112 detected by the camera 104 may have, for example, a yellow tint. In general, the degradation of the transparent layer 106 may include a shift or suppression of any portion of the electromagnetic spectrum.

Due to the degradation of the transparent layer 106 over time, barriers exist that may prevent the camera 104 of the computing device 110 from capturing content without color distortions. This document describes techniques for color correction using the sensor 126 to reduce color distortions of captured content 102 that is captured by the camera 104.

Example of Color Correction

While the computing device 110 depicted in 100-2 and 100-4 is a smartphone, other types of computing devices may also support the techniques described herein. FIG. 2 illustrates an example computing device 110 that may implement aspects of color correction in accordance with the techniques described herein. The computing device 110 is illustrated with various non-limiting example devices, including a desktop computer 202-1, a tablet 202-2, a laptop 202-3, a television 202-4, a computing watch 202-5, computing glasses 202-6, a gaming system 202-7, a microwave 202-8, and a vehicle 202-9. Other devices may also be used, including a home-service device, a smart speaker, a smart thermostat, a security camera, a baby monitor, a Wi-Fi® router, a drone, a trackpad, a drawing pad, a netbook, an e-reader, a home-automation and control system, a wall display, a virtual-reality headset, and/or another home appliance. The computing device 110 can be wearable, non-wearable but mobile, or relatively immobile (e.g., desktops and appliances).

The computing device 110 includes one or more processors 204 and one or more computer-readable medium (CRM) 206. Applications and/or an operating system (not shown) embodied as computer-readable instructions on the CRM 206 are executed by the processor 204 and provide some of the functionalities described herein. The CRM 206 also includes a manual input 208 (e.g., a haptic input, a voice input, or a visual input provided by a user to control operations of the computing device 110) and a brightness control 210 (e.g., to adjust a brightness of the display 108). The manual input 208 and the brightness control 210 may be implemented using hardware, software, firmware, or a combination thereof. In this example, the processor 204 implements the manual input 208 and the brightness control 210. Together, the manual input 208 and the brightness control 210 enable, in part, the processor 204 to process responses (e.g., input, electrical signals) from, for example, the display 108, the sensor 126, and/or the camera 104 to reduce color distortions associated with the camera 104.

The CRM 206 additionally includes a correction module 212 configured to receive inputs from the manual input 208, the brightness control 210, the display 108, the sensor 126, the camera 104, and so forth. The inputs can include an indication of an inactive state or an active state of the sensor 126, a first operational state or a second operational state of the display 108, detection of ambient light 112 and/or composite light using the sensor 126 or camera 104, an inactive or active state of the camera 104, a brightness of the display 108, instruction from a user via the manual input 208, and so forth. The correction module 212 uses these inputs to provide a color correction 214 that may be applied to captured content 102. The color correction 214 may include a color matrix used to modify the colors of the captured content 102 to reduce color distortions.

The computing device 110 may include the display 108, which may emit display light 216. The display light 216 may be generated by the computing device 110 to display content (e.g., a webpage, a message, a video, an image, and so forth) on the display 108. The display light 216 may also be configured to display light, colors, and patterns on the display 108 to enable the techniques of color correction 214. For example, the display light 216 may include a calibration light used by the correction module 212 to determine the color correction 214. The display 108 may be configured to at least partially cover a front surface of the computing device 110 and may include a pixel layer that comprises a plurality of pixels that emit light in color. For example, the pixels may contain varying amounts of red, green, blue (RGB) attributes used to display the captured content 102 in color. The captured content 102 may include a plurality of elements (e.g., distinct locations) that include RGB attributes. For example, a 200-element-wide by 100-element-long captured content 102 would include 20,000 elements, each of which corresponds to RGB attributes. The color correction 214 may include a color matrix that modifies the RGB attributes of the captured content 102 to reduce color distortions.

In general, the display 108 may also include one or more organic layers (e.g., emitting layer, emissive layer, an array of organic light-emitting diodes), a cathode, an anode, and so forth. The display 108 may further include one or more of an active-matrix organic light-emitting diode (AMOLED) display, organic light-emitting diode (OLED) display modules, light-emitting diode (LED) display modules, liquid crystal display (LCD) display modules, microLED display modules, display technologies with individually controllable pixels, thin-film technology display modules, or so forth. The display 108 may be rigid or flexible. Further, the display 108 may include a transparent layer 106 made of a transparent or semi-transparent material that is rigid or flexible.

The computing device 110 may include one or more sensors 126 used, in part, to perform the techniques described herein. The sensor 126 may include an optical sensor, one or more components of the camera 104, an ambient light sensor, a photoresistor, a photodiode, a phototransistor, and so forth. Although example implementations 100-2 and 100-4 depict the sensor 126 as being separate from the camera 104, components of the camera 104 may be used, instead of the sensor 126, to perform the techniques of the correction module 212 as further described with respect to FIGS. 3-1, 3-2, and 3-3.

Figures 1, 3:
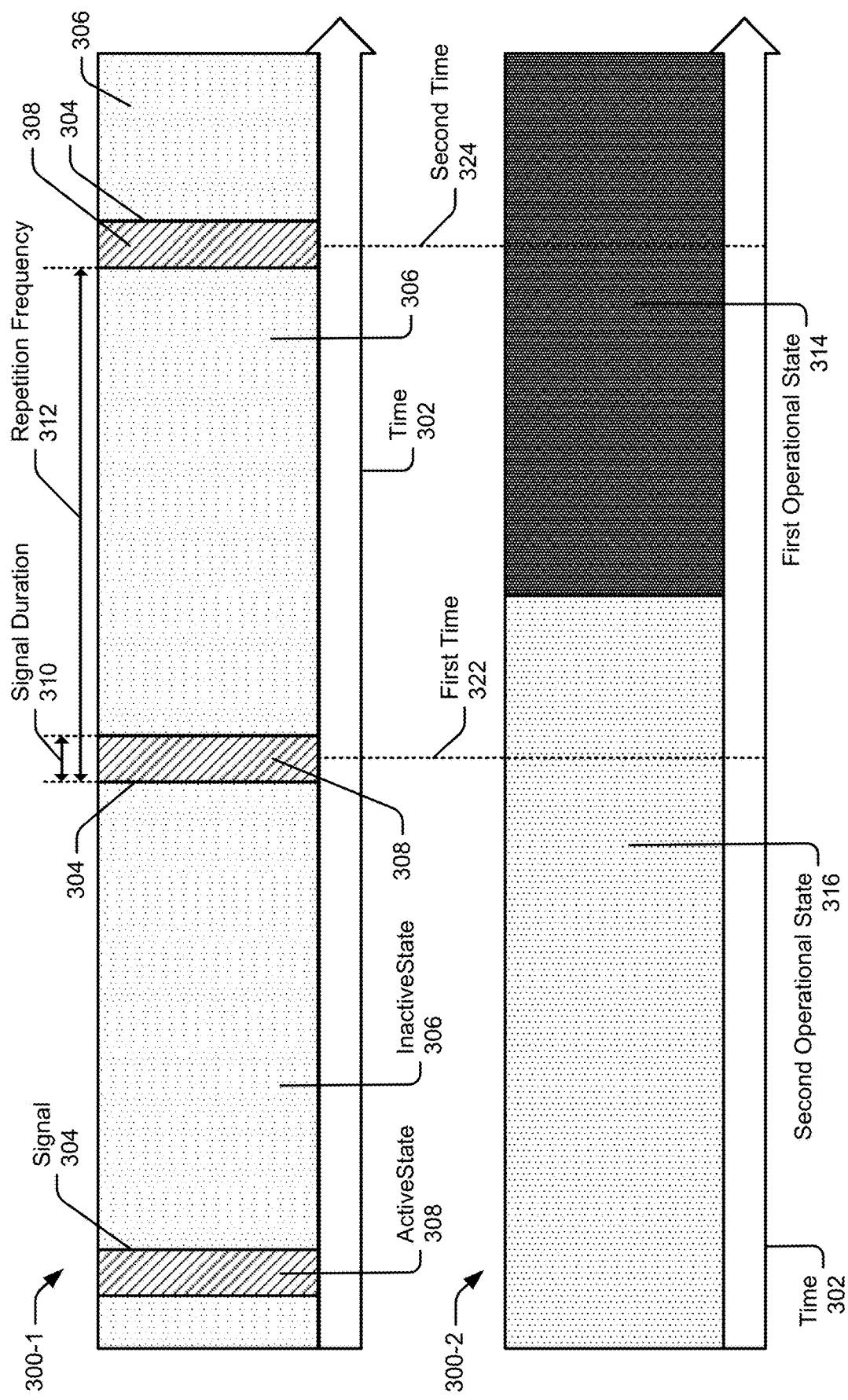
Figures 2, 3:
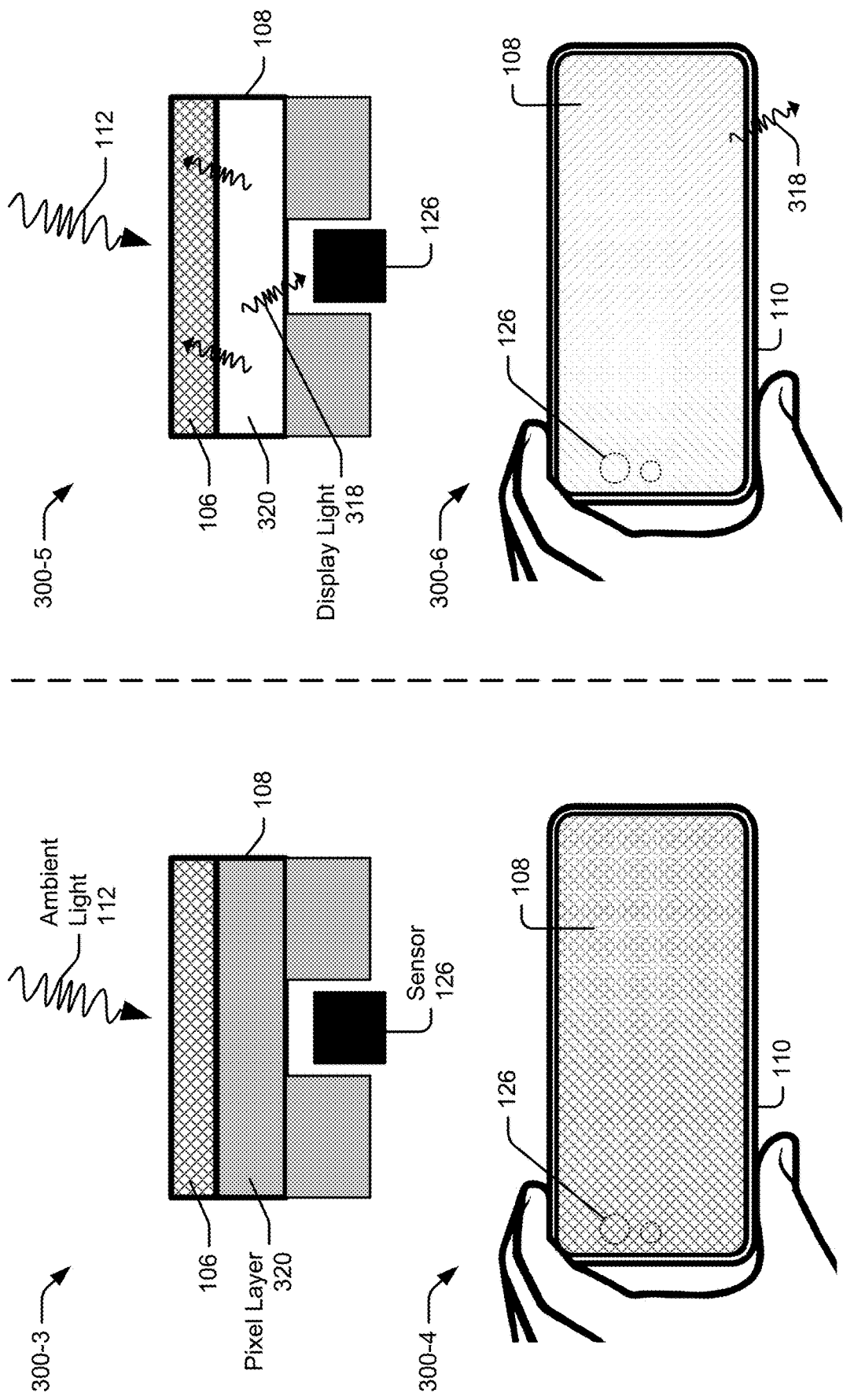
Figure 3:
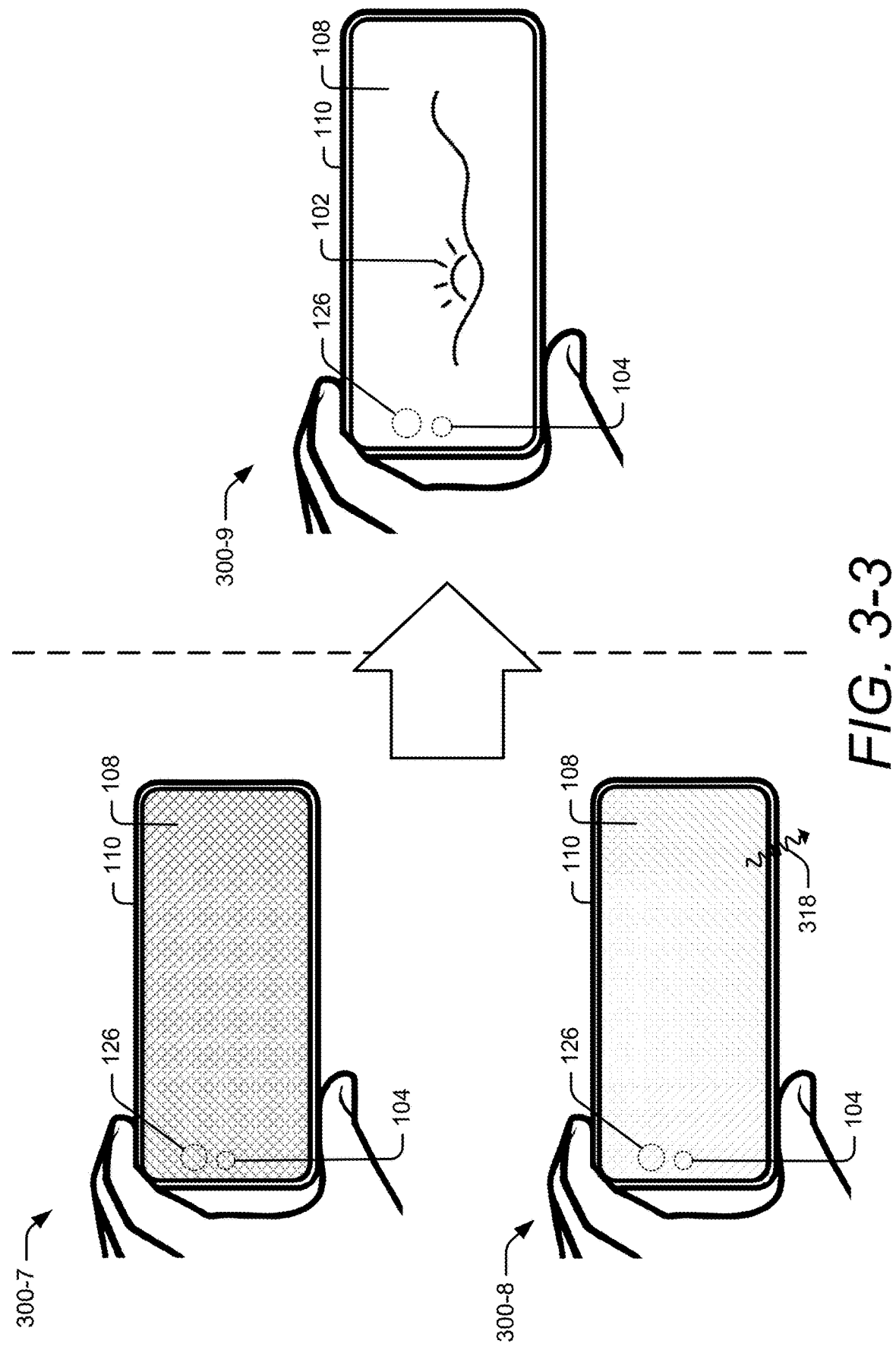

FIGS. 3-1, 3-2, and 3-3 illustrate example implementations 300 (e.g., time sequences 300-1 and 300-2, environments 300-3 through 300-9) of the color correction techniques performed by the correction module (e.g., the correction module 212 from FIG. 2) over time 302. The time sequence 300-1 depicts how a signal 304 corresponds to an inactive state 306 and an active state 308 of the sensor 126 over time 302. The time sequence 300-2 depicts operational states of the display 108 that change over time 302. The time 302 is similar in both 300-1 and 300-2. Environments 300-3 and 300-4 depict ambient light 112 that is detected by the sensor 126 as it passes through the display 108. Environments 300-5 and 300-6 depict a composite light that is detected by the sensor 126. Environments 300-7 and 300-8 depict a comparison of the ambient light 112 detected by the sensor 126 with the composite light detected by the sensor 126, performed by the correction module 212, to determine the color correction 214. Environment 300-9 depicts how the color correction 214 may be applied to captured content 102 to reduce color distortions.

The correction module 212 sends a signal 304 to a processor (e.g., the processor 204) to trigger the sensor 126 to transition from an inactive state 306 to an active state 308. The active state 308 enables the sensor 126 to detect light, and the inactive state 306 causes the sensor 126 to refrain from detecting light. The signal 304 may include a signal duration 310, which is a duration of time for the sensor 126 to detect enough light to perform operations of the correction module 212. The signal duration 310 may be adjusted to improve the user experience and may be configured to include a short amount of time 302 (e.g., a fraction of a second). At the end of the signal duration 310, the correction module 212 may instruct the processor 204 to trigger the sensor 126 to transition from the active state 308 to the inactive state 306.

The signal 304 may be repeated automatically over time 302 by a repetition frequency 312 (e.g., several seconds), which may be adjusted to improve the user experience. Alternatively, the signal 304 may be triggered by a manual input 208 received from the user. For example, the user may manually signal the sensor 126 to perform operations of the correction module 212 using a haptic input (e.g., a touch, swipe, scroll, or tap using a finger or hand of the user), a voice input, or a visual input.

After the sensor 126 transitions from the inactive state 306 to the active state 308, the correction module 212 receives an indication of an operational state of the display 108 as determined by, for example, an operating system, the processor 204, the display 108, and so forth. The operational state of the display 108 may include one of a first operational state 314 and a second operational state 316.

The second operational state 316 may indicate that the display 108 is refraining from emitting a display light 318 from a pixel layer 320 as depicted in environment 300-3 of FIG. 3-2. If an indication of the second operational state 316 is received by the correction module 212, then the sensor 126 may detect the ambient light 112 at a first time 322 (in FIG. 3-1), which may be modified by the transparent layer 106, resulting in color distortions.

The first operational state 314 may indicate that the display 108 is emitting the display light 318 as depicted in environment 300-5 of FIG. 3-2. This display light 318 may include RGB attributes used to display content (e.g., stored content, the captured content 102, moving content, and so forth). If an indication of the first operational state 314 is received or detected by the correction module 212, then the sensor 126 may detect a composite light at a second time 324 (in FIG. 3-1) that includes both the ambient light 112 (e.g., that is modified by the transparent layer 106, resulting in color distortions) and at least a portion of the display light 318 that is reflected off one or more inside surfaces of the display 108.

To improve the color correction 214, the display light 318 may include a calibration light that is emitted upon being triggered by the signal 304. The calibration light may include a plurality of wavelengths 118 used to calibrate the transmission 116. For example, the signal 304 triggers emission of the calibration light for the signal duration 310, and the calibration light may include a plurality of wavelengths 118. The calibration light may further include visible light 122 generated by an illuminator of a camera, a white light source, a white pattern, a calibration pattern using RGB attributes, and so forth. In aspects, the calibration light may be displayed on at least a portion of the display 108. For example, a white pattern may fill the entire display 108 or a small portion of the display 108 near the sensor 126. The intensity of the calibration light may be controlled by the brightness control 210 to increase an accuracy of the color correction 214. For example, the brightness of the calibration light may be increased to improve a calibration of the display 108. The RGB attributes associated with the calibration light may be stored on the CRM 206 and received by the correction module 212 to determine the color correction 214.

The correction module 212 may compare the ambient light 112 detected during the second operational state 316 with the composite light detected during the first operational state 314, as depicted in 300-7 and 300-8 of FIG. 3-3, to determine the color correction 214 required to reduce color distortions as shown in 300-9. For example, color correction 214 may be determined by the correction module 212 after the second time 324 and stored on the CRM 206. In another example, the color correction 214 may be determined upon receiving an active state of the camera 104. For example, a user provides a manual input 208 to activate their camera 104, and the correction module 212 receives this manual input 208. The correction module 212 then determines the color correction 214 (e.g., the color matrix) and applies it to the camera 104. The color correction 214 may be applied either before or after content (e.g., the captured content 102) has been captured by the camera 104.

The color correction 214 may be applied if the color correction 214 exceeds a correction threshold. The correction threshold may include a minimum correction required to apply the color correction 214 to the camera 104. For example, the color threshold for RGB attributes can be set at approximately 1% correction for any one of the red, green, and blue attributes. If the correction for any one of the RGB attributes exceeds 1%, then the color correction 214 may be applied. If, however, the color matrix includes corrections for RGB attributes that are all less than 1%, then the correction module 212 may refrain from applying the color correction 214.

Example Methods

FIG. 4 depicts an example method 400 for color correction using a sensor to reduce color distortions of a camera under a display. Method 400 is shown as sets of operations (or acts) performed and is not necessarily limited to the order or combinations in which the operations are shown herein. Furthermore, any of one or more of the operations can be repeated, combined, reorganized, or linked to provide a wide array of additional and/or alternative methods. In portions of the following discussion, reference may be made to environments and entities detailed in previous figures, reference to which is made for example only. The techniques are not limited to performance by one entity or multiple entities operating on one computing device 110.

At 402, a sensor of a computing device is signaled to transition from an inactive state or an active state. The sensor is positioned at least partially underneath a display of the computing device, and the active state enables the sensor to detect light. The sensor is signaled repeatedly over a duration of time. For example, a sensor 126 of a computing device 110 is triggered by a signal 304 from the correction module 212 to transition from an inactive state 306 to an active state 308. The sensor 126 is positioned at least partially underneath a display 108 of the computing device 110, and the active state 308 enables the sensor 126 to detect light, including the ambient light 112, the display light 318, the calibration light, and the composite light. The sensor 126 is signaled repeatedly over time 302 (e.g., the repetition frequency 312) as depicted in FIG. 3-1.

At 404, responsive to the signaling of the sensor, an indication of an operational state of the display is received. The operational state includes a first operational state or a second operational state. The first operational state is used to activate a display light. The display light emits light from the display when activated. The display light is generated by the computing device to display content on the display. The second operational state is used to deactivate the display light. The display light refrains from emitting light when deactivated. For example, responsive to triggering the sensor 126 with the signal 304, an indication of an operational state of the display 108 is received by the correction module 212. The operational state includes a first operational state 314 depicted in 300-5 or a second operational state 316 depicted in 300-3. The first operational state 314 is used to activate the display light 318, which may include the calibration light. The display light 318 emits light generated by the computing device 110 to display content on the display 108 when activated. The second operational state 316 is used to deactivate the display light 318. The display light 318 refrains from emitting light, including the calibration light, when deactivated.

At 406, responsive to receiving the indication of the second operational state, an ambient light is detected using the sensor at a first time within the duration of time. The ambient light is generated external to the computing device and modified by one or more layers of the display to cause color distortions in the detected ambient light. For example, responsive to receiving the indication of the second operational state 316, an ambient light 112 is detected using the sensor 126 at a first time 322 (e.g., within time 302) as depicted in FIG. 3-1. The ambient light 112 is generated external to the computing device 110 and modified by the display 108 (e.g., as the ambient light 112 travels through the transparent layer 106) to create color distortions.

At 408, responsive to receiving the indication of the first operational state, a composite light is detected using the sensor at a second time within the duration of time. The composite light includes the ambient light and at least a portion of the display light. For example, responsive to receiving the indication of the first operational state 314, a composite light is detected using the sensor 126 at a second time 324 (e.g., within time 302) as depicted in FIG. 3-1. The composite light includes the ambient light 112 and at least a portion of the display light 318 that is reflected off one or more inside surfaces of the display 108.

At 410, the composite light and the ambient light are compared to provide a color correction. The color correction is used to reduce color distortions of the detected ambient light as detected by the sensor through the display. For example, the composite light and the ambient light 112 are compared using the correction module 212 to provide a color correction 214, which may include a color matrix. The color correction 214 is used to reduce color distortions associated with the ambient light 112, which is modified by the transparent layer 106, as detected by the sensor 126 through the display 108 (depicted in FIGS. 1-1 and 1-2.)

At 412, the color correction is applied to content captured by a camera of the computing device. The camera is positioned at least partially underneath the display and used to receive the ambient light through the display. For example, the color correction 214 is applied to captured content 102 that is captured by a camera 104 of the computing device 110 by the correction module 212 as depicted in 300-9. The camera 104 is positioned at least partially underneath the display 108 and used to receive the ambient light 112 through the display 108 to create the captured content 102 (e.g., image or video).

CONCLUSION

Although methods including a color correction using a sensor to reduce color distortions of a camera under a display of a computing device have been described in language specific to features, it is to be understood that the subject of the appended claims is not necessarily limited to the specific techniques described herein. Rather, the specific techniques are disclosed as example implementation of color correction using a sensor to reduce color distortions of a camera under a display of a computing device.

The invention claimed is:

1. A method for color correction comprising:
signaling a sensor of a computing device to transition from an inactive state to an active state, the active state configured to enable the sensor to detect light, the sensor positioned at least partially underneath a display of the computing device, the signaling of the sensor being repeated over a duration of time;
responsive to the signaling of the sensor, receiving an indication of an operational state of the display, the operational state comprising:
a first operational state configured to activate a display light, the display light configured to emit light from the display when activated, the display light generated by the computing device to display content on the display; or
a second operational state configured to deactivate the display light, the display light further configured to refrain from emitting light when deactivated;
responsive to receiving the indication of the second operational state, detecting an ambient light using the sensor at a first time within the duration of time, the ambient light generated external to the computing device and modified by one or more layers of the display to cause color distortions in the detected ambient light;
responsive to receiving the indication of the first operational state, detecting a composite light using the sensor at a second time within the duration of time, the composite light comprising the ambient light and at least a portion of the display light;
comparing the composite light and the ambient light to provide a color correction, the color correction configured to reduce color distortions of the detected ambient light as detected by the sensor through the display; and
applying the color correction to content captured by a camera of the computing device, the camera positioned at least partially underneath the display, the camera configured to receive the ambient light through the display.

2. The method as recited by claim 1, the method for color correction further comprising receiving an indication of an active state of the camera, the active state of the camera configured to enable the camera to receive the ambient light, wherein the comparing of the composite light and the ambient light is performed responsive to receiving the indication of the active state of the camera.

3. The method as recited by claim 1, the method for color correction further comprising:
   responsive to receiving the indication of the first operational state, signaling the computing device to display a calibration light at the second time, the calibration light comprising a plurality of wavelengths of light; and
   detecting the composite light using the sensor at the second time, the composite light further comprising the calibration light.

4. The method as recited by claim 3, the method for color correction further comprising increasing a brightness of the calibration light responsive to the signaling of the computing device to display the calibration light at the second time.

5. The method as recited by claim 1, wherein the signaling of the sensor is further configured to repeat automatically within the duration of time at a repetition frequency, the repetition frequency configured to increase an accuracy of the color correction within the duration of time.

6. The method as recited by claim 1, wherein the detecting of the composite light using the sensor at the second time is performed responsive to a manual input from a user, the manual input comprising one or more of the following:
   a haptic input;
   a voice input; or
   a visual input.

7. The method as recited by claim 1, wherein the comparing of the composite light and the ambient light includes comparing the color correction to a correction threshold, and wherein the color correction is applied responsive to the color correction exceeding the correction threshold.

8. The method as recited by claim 1, wherein the sensor comprises one or more components of the camera.

9. The method as recited by claim 1, wherein the display comprises an active-matrix organic light-emitting diode (AMOLED) display.

10. The method as recited by claim 1, wherein the display comprises a flexible display, the flexible display configured to bend about a bend axis, the flexible display comprising a transparent layer, the transparent layer comprising a plastic material, the plastic material configured to bend about the bend axis.

11. The method as recited by claim 10, wherein the plastic material comprises polyimide, the polyimide configured to cause the color distortions within the duration of time.

* * * * *